(12) United States Patent
Tsutsumi et al.

(10) Patent No.: US 6,169,313 B1
(45) Date of Patent: Jan. 2, 2001

(54) STATIC SEMICONDUCTOR MEMORY DEVICE

(75) Inventors: Kazuhito Tsutsumi; Motoi Ashida; Yoshiyuki Haraguti; Hideaki Nagaoka; Eiji Hamasuna; Yoshikazu Kamitani, all of Hyogo (JP)

(73) Assignee: Mitsubishi Denki Kabushiki Kaisha, Tokyo (JP)

( * ) Notice: Under 35 U.S.C. 154(b), the term of this patent shall be extended for 0 days.

(21) Appl. No.: 09/328,588

(22) Filed: Jun. 10, 1999

(30) Foreign Application Priority Data

Dec. 21, 1998 (JP) .................................. 10-363040

(51) Int. Cl.[7] ............................. H01L 29/76; H01L 29/94
(52) U.S. Cl. .......................... 257/390; 257/393; 257/904; 365/154
(58) Field of Search ..................... 257/903, 904, 257/371, 377, 384, 390, 393; 365/154

(56) References Cited

U.S. PATENT DOCUMENTS 4,481,524 * 11/1984 Tsujide ................................... 357/42
5,654,572 * 8/1997 Kawase .................................. 257/371
5,930,163 * 7/1999 Hara et al. ............................. 365/154

FOREIGN PATENT DOCUMENTS 8-204030     8/1996   (JP) ...................................... 257/901

OTHER PUBLICATIONS

"A Perfect Process Compatible 2.49 $\mu m^2$ Embedded SRAM Cell Technology for 0.13 $\mu m$–Generation CMOS Logic LSIs", Y. Sambonsugi et al., 1998 Symposium on VLSI Technology Digest of Technical Papers, pp. 62–63.

"A High Performance 3.97$\mu m^2$ CMOS SRAM Technology Using Self–Aligned Local Innterconnect and Copper Interconnect Metallization", M.Woo et al., 1998 Symposium on VLSI Technology Digest of Technical Papers, pp. 12–13.

* cited by examiner

Primary Examiner—Donald L. Monin, Jr.
(74) Attorney, Agent, or Firm—McDermott, Will & Emery

(57) ABSTRACT

A shared contact is provided on the side of a drain active region of each of two load transistors. Thus, a stabilized low voltage operation is ensured in a full CMOS type SRAM memory cell having the shared contact.

16 Claims, 16 Drawing Sheets

STATIC SEMICONDUCTOR MEMORY DEVICE

BACKGROUND OF THE INVENTION

1. Field of the Invention

The present invention relates to a static semiconductor memory device (hereinafter abbreviated as an SRAM).

2. Description of the Background Art

Recently, energy conservation and low voltage operation of the semiconductor device included in a portable apparatus have become a growing concern for extending a lasting time of a battery included in the portable apparatus. Accordingly, the demand for an SRAM capable of performing the low voltage operation with reduced amount of power consumption is increasing. An SRAM memory cell for the low voltage operation generally includes six transistors and, in most cases, what is called a full CMOS (Complementary Metal Oxide Semiconductor) memory cell is used.

FIG. 12 is an equivalent circuit diagram of the SRAM memory cell. Referring to FIG. 12, the equivalent circuit of the SRAM memory cell includes: access transistors 1a and 1b of n type transistors; driver transistors 2a and 2b of n type transistors; load transistors 3a and 3b of p type transistors; bit lines 4a and 4b; a word line 5; and storage nodes 6a and 6b. Driver transistors 2a and 2b and load transistors 3a and 3b form a flip-flop circuit in the memory cell.

Next, two conventional examples will be described.

First, a layout pattern of an SRAM memory cell used in a first conventional example is shown in FIG. 13. In FIG. 13, a region of one memory cell is defined by a dotted line. Formed in one memory cell region are isolation insulating films 11a to 11c, n type active regions 12a to 12f, p type active regions 12g to 12j, and polycrystalline silicon interconnections to be interconnections for gate electrodes or interconnections (hereinafter shown as polycrystalline silicon interconnections) 13a to 13c for a layered structure of polycrystalline silicon and silicide. Further, first layer metal interconnections 15a to 15c and first contacts 14a to 14h connecting the active regions and polycrystalline silicon interconnections to the first layer metal interconnections are formed. Second layer metal interconnections 17a to 17d and second contacts 16a to 16d connecting the active layers and second layer metal interconnections are also formed.

Next, each portion of the equivalent circuit of the SRAM memory cell shown in FIG. 12 will be described with reference to FIG. 13. It is noted that, for an access transistor, active regions connected to the bit line and driver transistor are hereinafter conveniently referred to as drain and source active regions, respectively.

Access transistor 1a includes drain active region 12a, interconnection 13a for a gate electrode and source active region 12b, whereas access transistor 1b includes drain active region 12d, interconnection 13a for gate electrode and source active region 12e. Driver transistor 2a includes drain active region 12b, interconnection 13b for gate electrode and source active region 12c, whereas driver transistor 2b includes drain active region 12e, interconnection 13c for gate electrode and source active region 12f. Load transistor 3a includes drain active region 12g, interconnection 13b for gate electrode and source active region 12h, whereas load transistor 3b includes drain active region 12i, interconnection 13c for gate electrode and source active region 12j.

Further, each of bit lines 4a, 4b and word line 5 shown in FIG. 12 correspond to interconnections 17a, 17b and 13a in FIG. 13. Interconnection 15c in FIG. 13 corresponds to a Vcc interconnection, and interconnections 17c and 17d correspond to GND interconnections.

Contacts 14a, 14c and 14e in FIG. 13 correspond to a group of contacts of storage node 6a which are mutually connected at a first layer metal interconnection 15a, and contacts 14b, 14d and 14f correspond to a group of contacts of storage node 6b which are mutually connected at first layer metal interconnection 15b.

FIG. 14 is a cross sectional view taken along the line I—I in FIG. 13. FIG. 14 mainly shows a silicon substrate 21, a p type well 20p, n⁻ active regions 23a to 23d, silicon oxide films 24a to 24d which are sidewall insulation layers of the transistors, and interlayer insulation films 25a and 25b. The other parts of the structure which are denoted by reference characters in FIG. 14 correspond to those denoted by the same reference characters in FIG. 13. Therefore, description thereof is not repeated.

A layout pattern of an SRAM memory cell used in a second conventional example is shown in FIG. 15. The second conventional example is different from the first conventional example in that first contacts 14i and 14j generally include a structure which is called a shared contact. The shared contact connects a polycrystalline silicon interconnection, active region and first layer metal interconnection together with one contact. In other words, although n type active region 12b and interconnection 13c are connected to interconnection 15a through two contacts 14a and 14c in FIG. 13, they are connected to interconnection 15a through one contact 14i in FIG. 15. This is the same for contact 14j in FIG. 15.

If the shared contact is used, reduction in a cell size is generally achieved as the number of contacts decreases.

For the above described memory cell of the second conventional example, a highly skilled technique is required to ensure overlay accuracy for photolithography as the first metal interconnection is simultaneously connected to both of the polycrystalline silicon interconnection and active region with one contact by using the shared contact. The memory cell of the first or second conventional example is selected in accordance with equipment performance in each manufacturing factory.

The above described full CMOS type SRAM memory cell suffers from the following four problems.

The first problem is associated with the second conventional example, and is that although the shared contact allows reduction in the cell size as compared with the memory cell of the first conventional example, it makes the low voltage operation more difficult as compared with the first conventional example.

The reason which has been found for the first time will now be described.

FIG. 15 shows a relation between the memory cell pattern of the second conventional example and cell current during reading operation. The cell current flows from a bit line load to a GND through the bit line and the storage node on the Low side. When storage node 6a in FIG. 14 is at the Low level, current I1 shown in FIG. 15 flows and, when storage node 6b in FIG. 12 is at the Low level, current I2 shown in FIG. 15 flows. Here, only current I1 flows through a portion defined by a relatively narrow width W1 between polycrystalline silicon interconnection 13c and isolation insulation film 11a in a current path. Generally, however, W1 hardly affects a current value of current I1, and current values I1 and I2 are almost equal.

On the other hand, when a mask for the polycrystalline silicon interconnection is displaced with respect to the isolation insulation film in direction toward a top portion of the sheet of the drawing, a width W2 corresponding to the above mentioned W1 becomes extremely narrow. Thus, for the cell current values, I1 decreases as compared with I2. This may result in imbalance characteristic of the memory cell and the memory cell operation at the low level becomes worst. More specifically, shortage of current on the side of I1 makes it difficult for storage node 6a to attain to the Low level.

On the other hand, for the memory cell of the first conventional example in FIG. 13, a maximum voltage for operation is better than that of the second conventional example as the cell current is not reduced by displacement of the mask.

The second problem is associated with a large memory cell size, which problem is related to both of the first and second conventional examples. A TFT (Thin Film Transistor) low side or high resistance load type memory cell in which four transistors are formed on a substrate has previously been used because of each small memory cell size though it is not suited to the low voltage operation. In the case of the four CMOS type, however, the memory cell size is large as six transistors are formed on a substrate though this suited to the low voltage operation.

The third problem is associated with increase in a contact resistance, which is related to both of the first and second conventional examples. The contact resistance is only increased as a contact area is decreasing with a smaller memory cell size. The increase in the contact resistance results in a parasitic resistance of the memory cell, thereby adversely affecting the memory cell operation.

When the contact resistance related to the GND interconnection for second contact 16c or 16d in FIG. 13 increases, a GND potential in the memory cell increases when cell current flows in a reading operation. Thus, the memory cell data is lost.

The fourth problem is associated with reduction in a software error resistance, which is related to both of the first and second conventional examples. At a low power supply voltage, as the power supply voltage is still low even if a memory cell capacitance which is the same as that of the conventional case is formed, an amount of accumulated electric charges of the storage node decreases. Thus, the software error resistance might be reduced.

SUMMARY OF THE INVENTION

An object of the present invention is to enable a low voltage operation in a memory cell in which a shared contact is used.

Another object of the present invention is to reduce a size of the memory cell.

Another object of the present invention is to reduce a contact resistance.

Another object of the present invention is to increase a software error resistance even at a low power supply voltage.

A static semiconductor memory device according to one aspect of the present invention includes: a first drain active region of a first transistor having a first type conductivity; a second drain active region of a second transistor having the first type conductivity; a third drain active region of a third transistor having a second type conductivity; a fourth drain active region of a fourth transistor having the second type conductivity; first and second active regions of a fifth transistor having the first type conductivity; third and fourth active regions of a sixth transistor having the first type conductivity; a first interconnection for a gate electrode which is successively arranged for and shared by the first and third transistors; a second interconnection for gate electrode which is successively arranged for and shared by the second and fourth transistors; a first interconnection electrically connecting the first drain active region, third drain active region and second interconnection for gate electrode; and a second interconnection electrically connecting the second drain active region, fourth drain active region and first interconnection for gate electrode, where the first drain active region and second active region are electrically connected and the second drain active region and fourth active region are electrically connected. In the static semiconductor memory device, the first interconnection is electrically connected to the third drain active region and the second interconnection for gate electrode through a first contact, and the second interconnection is electrically connected to the fourth drain active region and the first interconnection for gate electrode through a second contact.

According to one aspect of the present invention, a shared contact is provided in the active region which is not on a path of cell current, a low voltage operation of the memory cell can be achieved.

In the static semiconductor memory device according to the above mentioned aspect, preferably, an area in which the first interconnection and third drain active region are in contact is larger than that in which first interconnection and second interconnection for gate electrode are in contact in the first contact, and an area in which of the second interconnection and fourth drain active region are in contact is larger than that in which the second interconnection and first interconnection for gate electrode are in contact in the second contact.

Thus, the area of the shared contact on the side of the active region is increased, so that the contact resistance is reduced and the current from a load transistor readily flows to an n type active region. As a result, a potential of the n type active region quickly attains to a High level. In the static semiconductor memory device according to the above mentioned aspect, an active region is further provided which is formed directly below the first or second interconnection with an insulation layer interposed and separated from all of the first to fourth drain active regions.

As a region in which the active region and a polycrystalline silicon interconnection overlap is provided in addition to a transistor region, a memory cell capacitance and the software error resistance can be increased.

In the static semiconductor memory device according to the above mentioned aspect, preferably, an active region is further provided which is formed directly below the first or second interconnection with an insulation layer interposed and is continuous to one of the first to fourth drain active regions.

Thus, provision of a region in which the active region continuous to one of the drain active regions and a polycrystalline silicon interconnection overlap increases a memory cell capacitance, so that the software error resistance can be increased.

A static semiconductor device according to another aspect of the present invention includes: first drain and source active regions of a first transistor having a first type conductivity; second drain and source active regions of a second transistor having the first type conductivity; third drain and source active regions of a third transistor having a second type conductivity; fourth drain and source active regions of a fourth transistor having the second type conductivity; first and second active regions of a fifth transistor having the first type conductivity; third and fourth active region of a sixth transistor having the first type conductivity; first and second bit lines; first and second power supply interconnections; a first interconnection for a gate electrode which is successively arranged for and shared by the first and third transistors; a second interconnection for gate electrode which is successively arranged for and shared by the second and fourth transistors; and a third interconnection for gate electrode which is successively arranged for and shared by the fifth and sixth transistors. In the static semiconductor memory device, the first drain active region and the second active region are electrically connected, the second drain active region and the fourth active region are electrically connected, the first drain active region, third drain active region and second interconnection for gate electrode are electrically connected to the first interconnection through a first contact group, the second drain active region, fourth drain active region and first interconnection for gate electrode are electrically connected to the second interconnection through a second contact group, the first source active region is electrically connected to a first power supply interconnection through a first contact, the second source active region is electrically connected to the first power supply interconnection through a second contact, the third source active region is electrically connected to a second power supply interconnection through a third contact, the fourth source active region is electrically connected to the second power supply interconnection through a fourth contact, the first active region is electrically connected to the first bit line through a fifth contact, and the third active region is electrically connected to the second bit line through a sixth contact. In the static semiconductor memory device, the first and third contacts have contact structures of self-aligning with the first interconnection for gate electrode, the second and fourth contacts have contact structures of self-aligning with the second interconnection for gate electrode, and the fifth and sixth contacts have contact structures of self-aligning with the third interconnection for gate electrode.

According to another aspect of the present invention, as the contact which is connected to the power supply interconnection and bit line self-aligns with a polycrystalline silicon interconnection, a size of the memory cell can be reduced.

Preferably, the static semiconductor device according to the above mentioned another aspect further includes: a first protection insulation film formed on the first interconnection for gate electrode; a second protection insulation film formed on the second interconnection for gate electrode; a third protection insulation film formed on the third interconnection for gate electrode; a first sidewall insulation film formed in contact with sidewalls of the first interconnection for gate electrode and first protection insulation film; a second sidewall insulation film formed in contact with sidewalls of the second interconnection for gate electrode and second protection insulation film; a third sidewall insulation film formed in contact with sidewalls of the third interconnection for gate electrode and third protection insulation film; and an interlayer insulation film covering the first, second and third protection insulation films and the first, second and third sidewall insulation films and including a material which is different from that of the first, second and third protection insulation films and the first, second and third sidewall insulation films.

Thus, a self-aligning contact can be achieved.

In the static semiconductor memory device according to the above mentioned another aspect, preferably, the first, second and third protection insulation films and the first, second and third sidewall insulation films include silicon nitride films, and the interlayer insulation film includes a silicon oxide film.

Thus, the self-aligning contact can be achieved.

Preferably, in the static semiconductor memory device according to the above mentioned another aspect, an isolation insulation films are provided on either side of each of the first to fourth source active regions and on either side of each of the first and third active regions, where at least one of the first to sixth contacts overlaps the isolation insulation film on either side when viewed from above.

As the self-aligning contact further overlaps the isolation insulation film, a contact area is substantially increased and the memory cell operation can be stabilized.

In the static semiconductor memory device according to the above mentioned another aspect, preferably, an interconnection used for connection at the contact is in contact with the isolation insulation film at a bottom portion of the contact in a portion where the contact and isolation insulation film overlap when viewed from above, and a protection film is provided on the isolation insulation film for contact etching.

As the self-aligning contact is in contact with the isolation insulation film at the bottom portion, junction leakage current is prevented.

Preferably, in the static semiconductor memory device according to the above mentioned another aspect further includes: a seventh contact included in a first contact group and formed in the first active region; an eighth contact included in a second contact group and formed in the second drain active region; a ninth contact included in the first contact group and formed in the third drain active region; and a tenth contact included in the second contact group and formed in the fourth drain active region, where the first interconnection is in contact with the isolation insulation film at the bottom portions of the seventh and ninth contacts and the second interconnection is in contact with the isolation insulation film at the bottom portions of the eighth and tenth contacts in overlapping portions of the seventh to tenth contacts and the isolation insulation film.

As the groups of contacts for connection of storage nodes are also self-aligning contacts and brought into contact with the isolation insulation film at the bottom portions of the contacts, further reduction in the size of the memory cell can be achieved.

In the static semiconductor memory device according to the above mentioned another aspect, preferably, the first to fourth drain active regions, the first to fourth source active regions and the first to fourth active regions have higher impurity concentrations only in portions directly below and in vicinity of the contacts of the first and second contact groups and the first to sixth contacts, and have lower impurity concentrations in the other portions.

As the bottom portion of the self-aligning contact is an impurity active region with high concentration, the contact resistance of the self-aligning contact can be reduced.

Preferably, the static semiconductor memory device according to the above mentioned another aspect further includes an active region which is formed directly below the first or second interconnection for gate electrode with an insulation layer interposed and separated from all of the first to fourth drain active regions.

As a region in which the active region and polycrystalline silicon interconnection overlap is provided in addition to the transistor region, memory cell capacitance and software error resistance can be increased.

Preferably, the static semiconductor memory device according to the above mentioned another aspect further includes an active region which is formed directly below the first or second interconnection for gate electrode with an insulation layer interposed and connected to one of the first to fourth drain active regions.

As a region in which the active region and polycrystalline silicon interconnection overlap is provided in addition to the transistor region, memory cell capacitance and software error resistance can be increased.

A static semiconductor memory device according to still another aspect of the present invention includes: a first drain active region of a first transistor having a first type conductivity; a second drain active region of a second transistor having the first type conductivity; a third drain active region of a third transistor having a second type conductivity; a fourth drain active region of a fourth transistor having the second type conductivity; first and second active regions of a fifth transistor having the first type conductivity; third and fourth active regions of a sixth transistor having the first type conductivity; a first interconnection for gate electrode which is successively arranged for and shared by the first and third transistors; a second interconnections for gate electrode which is successively arranged for and shared by the second and fourth transistors; a first interconnection electrically connecting the first drain active region, third drain active region and second interconnection for gate electrode; and a second interconnection electrically connecting the second drain active region, fourth drain active region and first interconnection for gate electrode, where the first drain active region and second active region are electrically connected, the second drain active region and fourth active region are electrically connected, and the first and second interconnections are formed of polycrystalline silicon including p type impurities.

According to still another aspect of the present invention, as a polycrystalline silicon interconnection including p type impurities is used for an interconnection connecting n and p type active regions, reduction in the size of the memory cell can be achieved.

Preferably, the static semiconductor memory device according to the above mentioned still another aspect further includes an active region which is formed directly below the first or second interconnection for gate electrode with an insulation layer interposed and separated from all of the first to fourth drain active regions.

As a region in which the active region and polycrystalline silicon interconnection overlap is provided in addition to a transistor region, memory cell capacitance and software error resistance can be increased.

Preferably, the static semiconductor memory device according to the above mentioned still another aspect further includes an active region which is formed directly below the first or second interconnection for gate electrode with an insulation layer interposed and connected to one of the first to fourth drain active regions.

As a region in which the active region and polycrystalline silicon interconnection overlap is provided in addition to the transistor region, memory cell capacitance and software error resistance can be increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
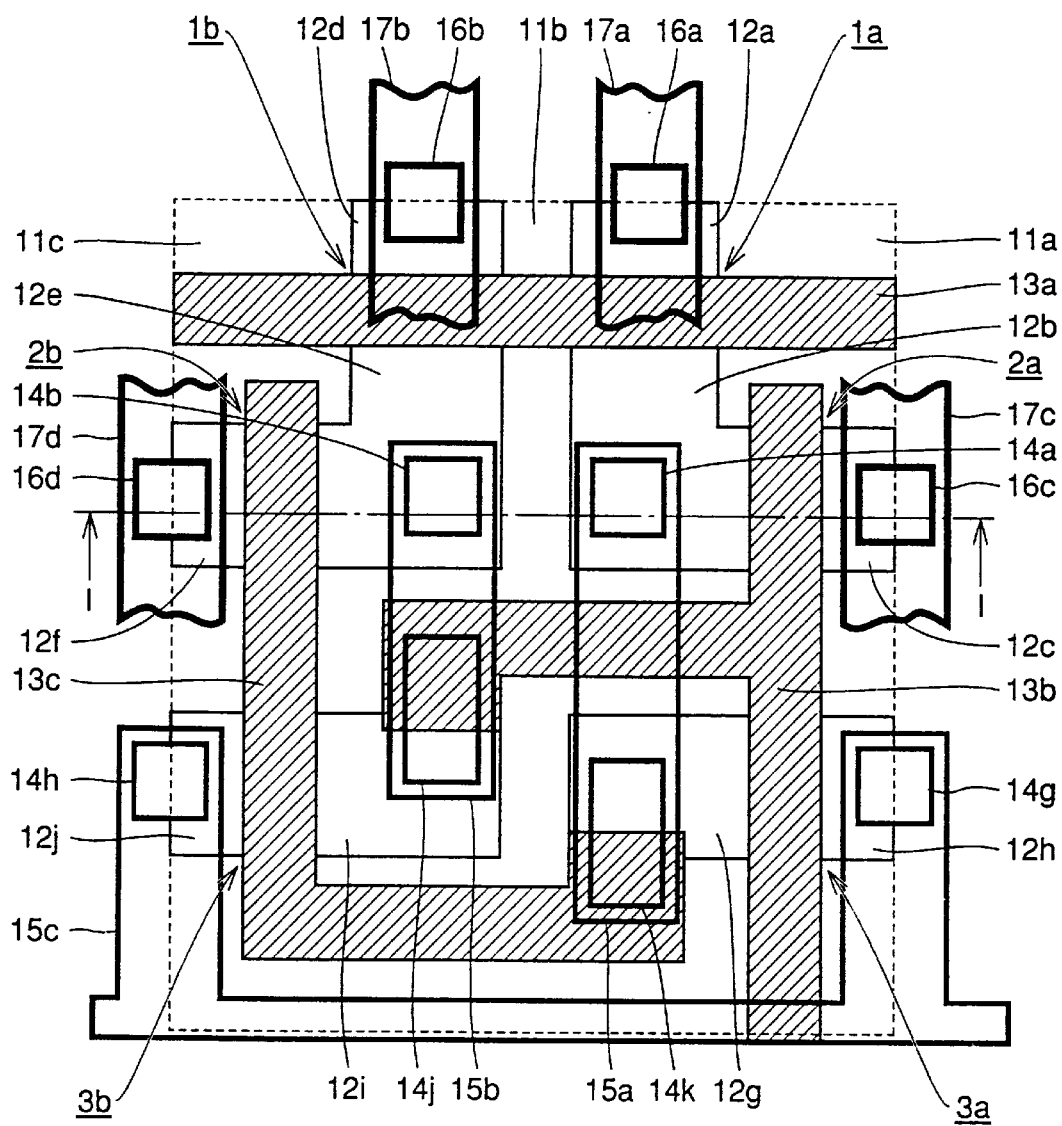
FIG. 1 is a view showing a pattern of an SRAM memory cell according to a first embodiment of the present invention.

In FIG. 1, one memory cell region is defined by a dotted line. Formed in the memory cell region are: isolation insulation films 11a to 11c; n type active regions 12a to 12f; p type active regions 12g to 12j; and polycrystalline silicon interconnections 13a to 13c to be interconnections for gate electrodes. In addition, formed in the memory cell region are: first contacts 14a, 14b, 14g and 14h connecting the active regions and first layer metal interconnections; first contacts 14k and 14j which are generally called shared contacts connecting the active regions, polycrystalline silicon interconnections and first layer metal interconnections;

and first layer metal interconnections 15a to 15c. Second contacts 16a to 16d connecting the active layers and second layer metal interconnections as well as second layer metal interconnections 17a to 17d are also formed.

Figure 12:
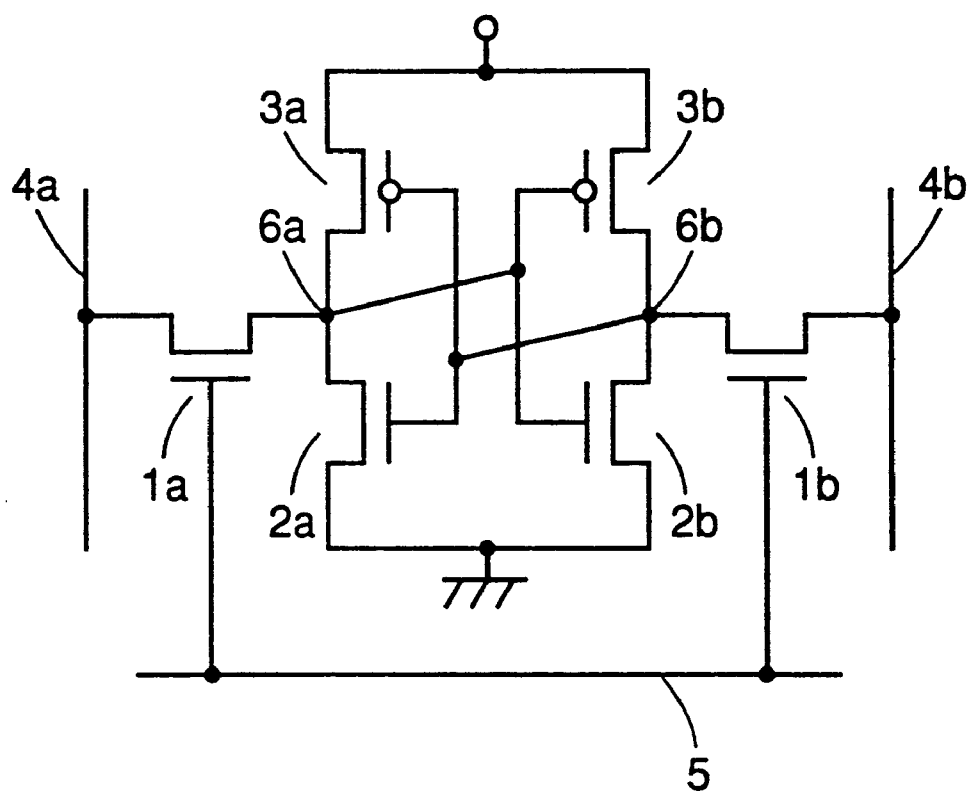
FIG. 12 is a diagram showing an equivalent circuit in a conventional SRAM.

Successively, portions of an equivalent circuit of the SRAM memory cell shown in FIG. 12 will be described with reference to FIG. 1. It is noted that the equivalent circuits of memory cells according to the conventional example and the present embodiment are the same.

An access transistor 1a includes drain active region 12a, interconnection 13a for gate electrode and source active region 12b, whereas an access transistor 1b includes drain active region 12d, interconnection 13a for gate electrode and source active region 12e. A driver transistor 2a includes drain active region 12b, interconnection 13b for gate electrode and source active region 12c, whereas a driver transistor 2b includes drain active region 12e, interconnection 13c for gate electrode and source active region 12f. A load transistor 3a includes drain active region 12g, interconnection 13b for gate electrode and source active region 12h, whereas a load transistor 3b includes drain active region 12i, interconnection 13c for gate electrode and source active region 12j. Further, bit lines 4a, 4b and word line 5 shown in FIG. 12 corresponded to interconnections 17a, 17b and 13a in FIG. 1. Interconnection 15c in FIG. 1 corresponds to a Vcc interconnection, and interconnections 17c and 17d correspond to GND interconnections.

Contacts 14a and 14k in FIG. 1 correspond to a group of contacts of a storage node 6a connected through first layer metal interconnection 15a, and contacts 14b and 14j correspond to a group of contacts of a storage node 6b connected through first layer metal interconnection 15b.

Figure 2:
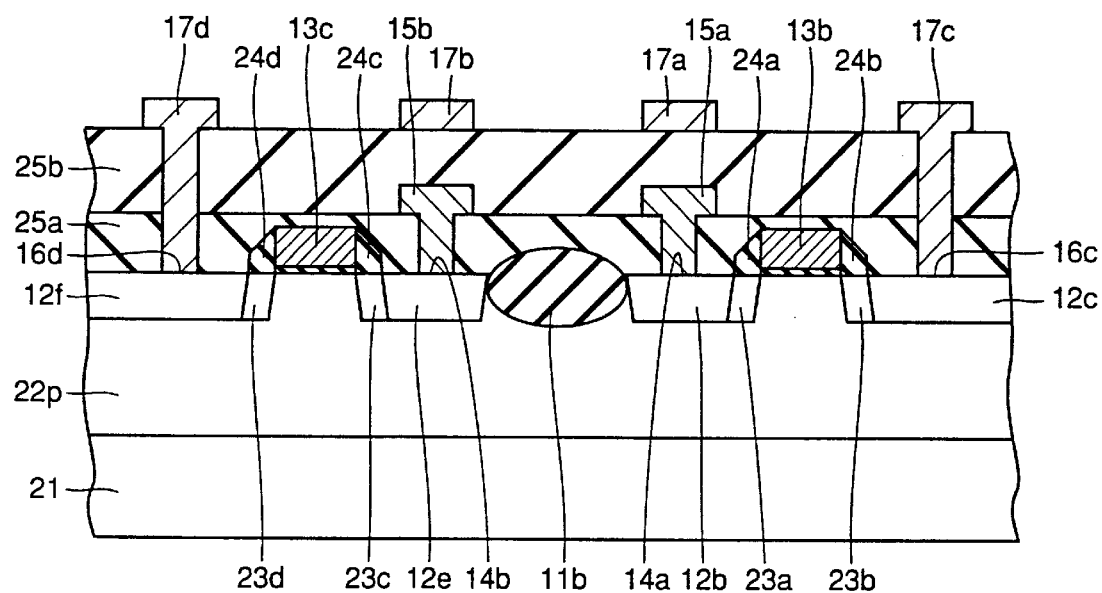
FIG. 2 is a cross sectional view showing the SRAM memory cell according to the first embodiment of the present invention.

FIG. 2 is a cross sectional view taken along the line I—I shown in FIG. 1. FIG. 2 mainly shows: a silicon substrate 21; a p type well 22p; n⁻ active regions 23a to 23d; sidewall insulation layers 24a to 24d for transistors formed of silicon oxide films; and interlayer insulation films 25a and 25b. Other parts of the structure denoted by reference characters in FIG. 2 correspond to those denoted by the same reference characters in FIG. 1, and therefore description thereof will not be repeated.

Figure 16:
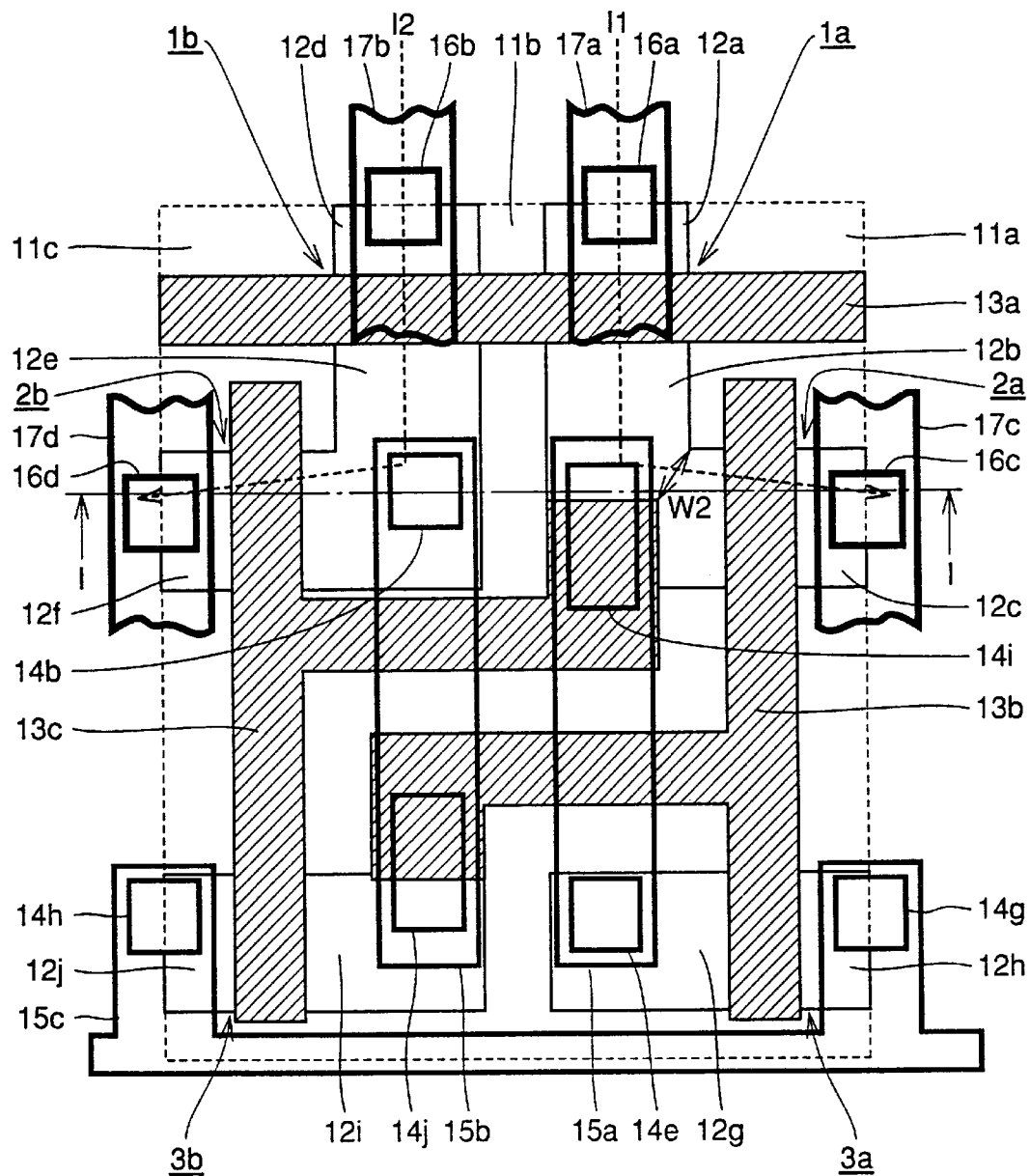
FIG. 16 is a view showing a pattern of the SRAM memory cell of the second conventional example in the case where a mask is displaced.

The memory cell according to the first embodiment is different from that of the second conventional example in the arrangement of the shared contact. As shown in FIG. 16, in the second conventional example, the shared contact corresponds to contacts 14i and 14j respectively connected to n and p type active regions. On the other hand, in the present embodiment, the shared contact corresponds to contacts 14k and 14j both connected to p type active regions. Thus, as to cell current during reading operation shown in FIG. 16, a width of the current path is not made narrower by displacement of the mask for polycrystalline silicon interconnections 13a to 13c since there is no shared contact in the cell current path in the present embodiment shown in FIG. 1, so that current values of cell current I1 and I2 are equal. Therefore, a characteristic of the memory cell is improved and a low voltage operation of the memory cell using the shared contact is enabled, which is an object of the present invention.

Second Embodiment

Figure 3:
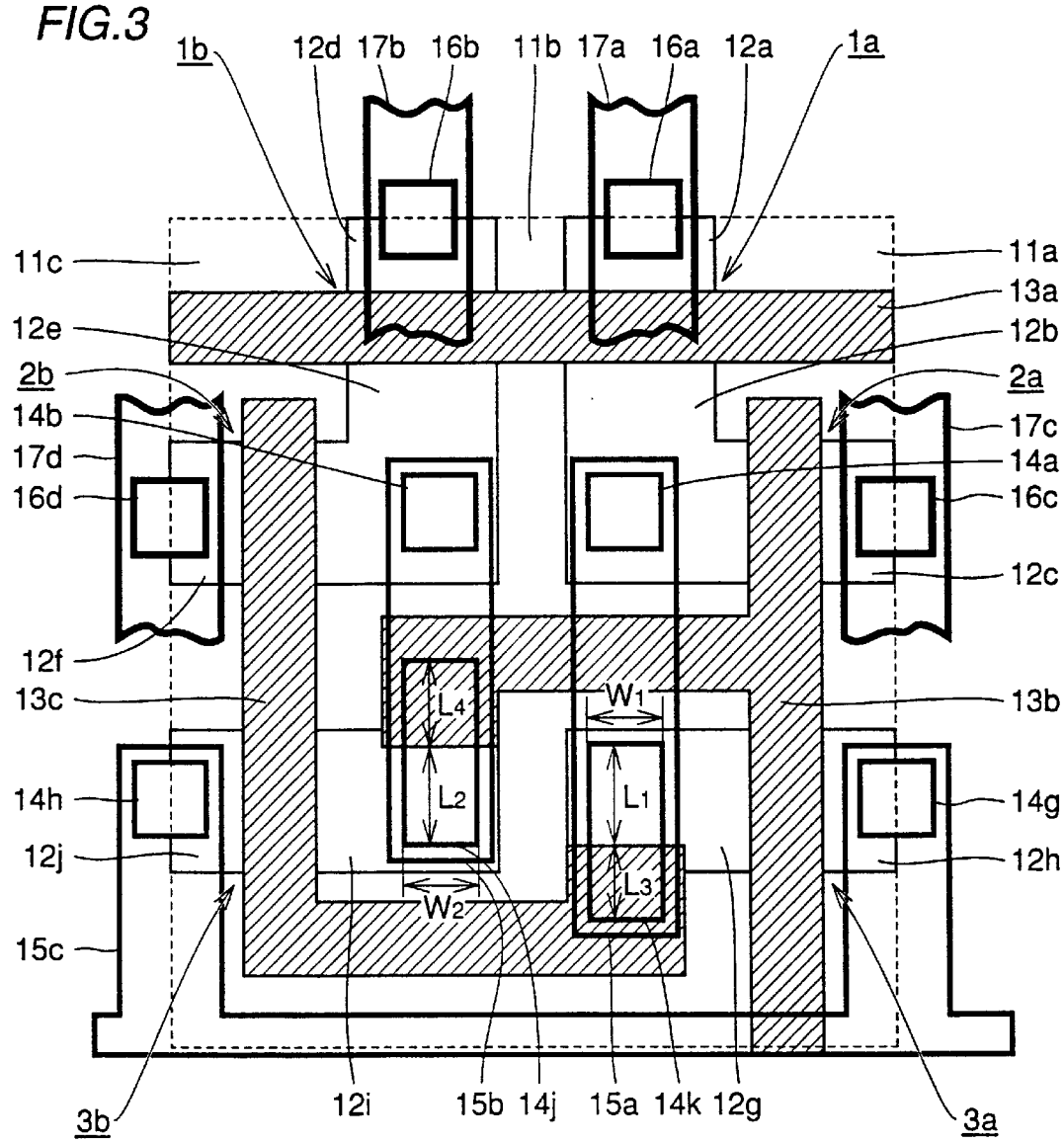
FIG. 3 is a view showing a pattern of an SRAM memory cell according to a second embodiment of the present invention.

FIG. 3 is a view showing a pattern of an SRAM memory cell according to a second embodiment with the present invention. The second embodiment is different from the first embodiment in areas (real estates of the contacts when viewed from above) occupied by active regions 12g and 12i and by polycrystalline silicon interconnections 13b and 13c at shared contacts 14k and 14j. It is noted that the area is obtained by multiplying a width ($W_1$, $W_2$) by a length ($L_1$ to $L_4$) of each contact. Although the above mentioned areas are almost equal in the first embodiment, in the present embodiment, the areas on the side of active regions 12g and 12i are larger than those on the side of polycrystalline silicon interconnections 13b and 13c. In other words, $L_1 > L_3$, $L_2 > L_4$.

This is related to stabilization of the memory cell operation by rapidly increasing the potential of n type active region 12b or 12e shown in FIG. 3 to the High level during writing operation. More specifically, if the areas on the side of active regions 12g and 12i of shared contacts 14k and 14j are larger than those on the side of polycrystalline silicon interconnections 13b and 13c, the contact resistances on the side of active regions 12g and 12i are reduced, so that current more readily flows from load transistor 3a or 3b to n type active region 12b or 12e shown in FIG. 3. Thus, the potential of the above mentioned n type active region 12b or 12e can rapidly be increased to the High level.

Thus, the present embodiment also provides stabilization during the writing operation in addition to the effect described in conjunction with the first embodiment.

Third Embodiment

Figure 4:
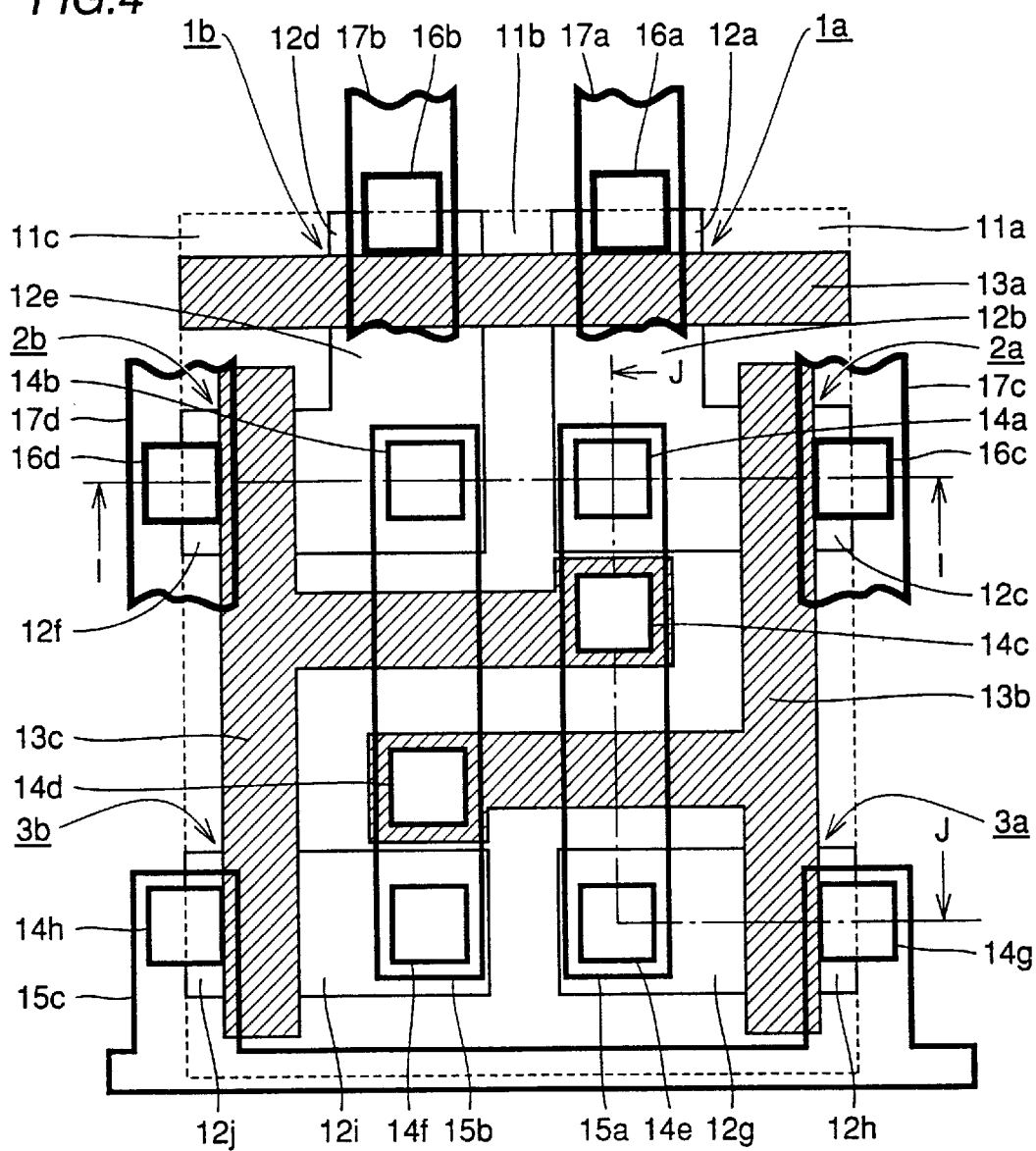
FIG. 4 is a view showing a pattern of an SRAM memory cell according to a third embodiment of the present invention.
Figure 13:
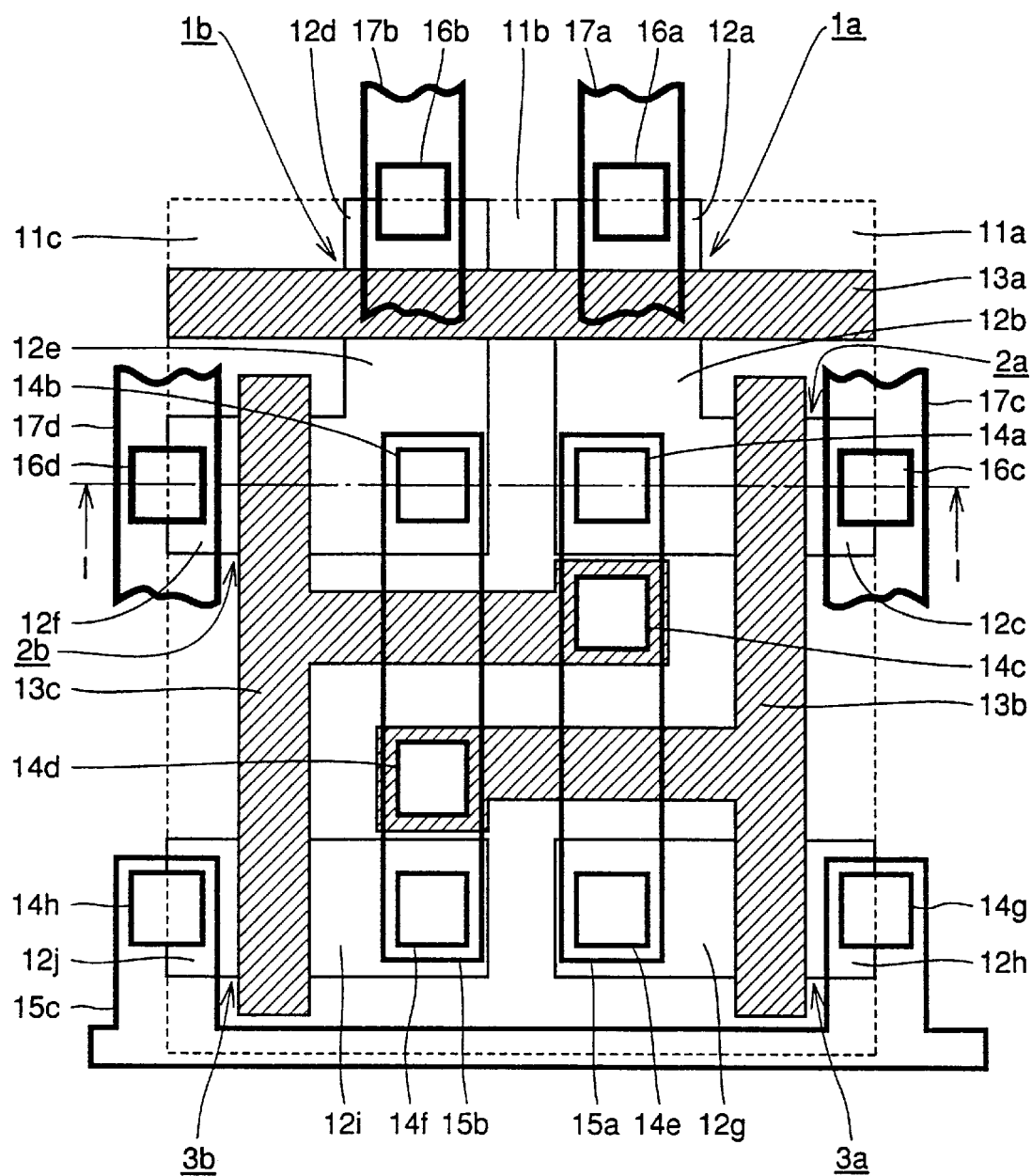
FIG. 13 is a view showing a pattern of an SRAM memory cell of a first conventional example.
Figure 14:
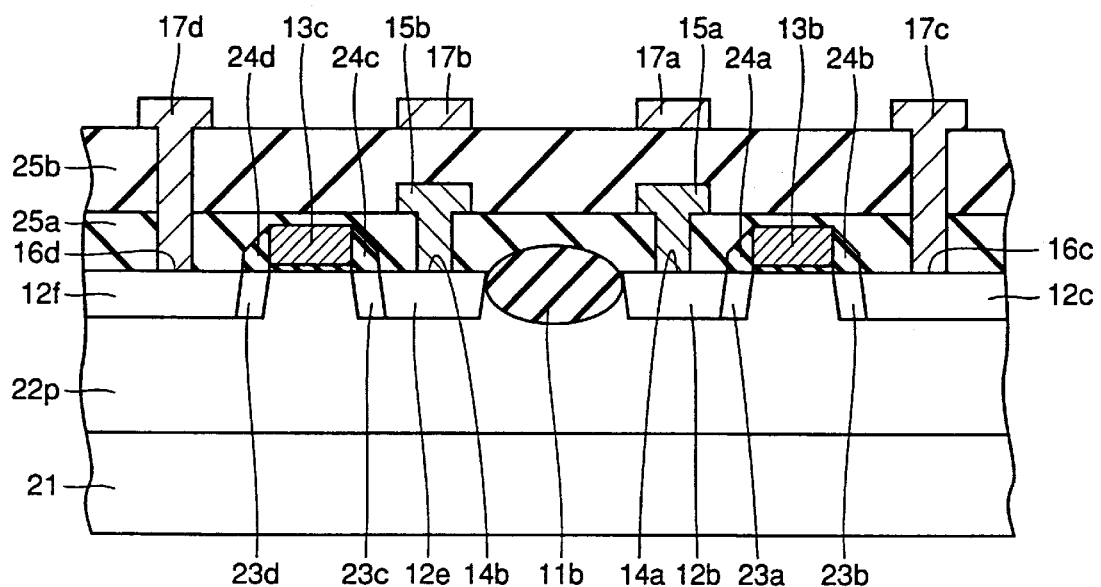
FIG. 14 is a cross sectional view showing the SRAM memory cell of the first conventional example.

The present embodiment is an improvement on the first conventional example. Thus, it is different from the first embodiment in two respects. The first difference is that, although shared contacts 14k and 14j are used as a first contact as shown in FIG. 1 in the first embodiment, in the present embodiment, general contacts 14c, 14e, 14d and 14f are used as shown in FIG. 4. Thus, the patterns of the first contacts of the first conventional example (FIGS. 13 and 14) and the present embodiment (FIG. 4) correspond to each other.

The second difference is that first contacts 14g and 14h and second contacts 16a to 16d are contacts self-aligning with respect to polycrystalline silicon interconnections 13a to 13c in the present embodiment. The term self-aligning used herein means that even if the contact overlaps the polycrystalline silicon interconnection when viewed from above, it is not in contact with the polycrystalline silicon interconnection. This will be described in further detail with reference to FIG. 5.

Figure 5:
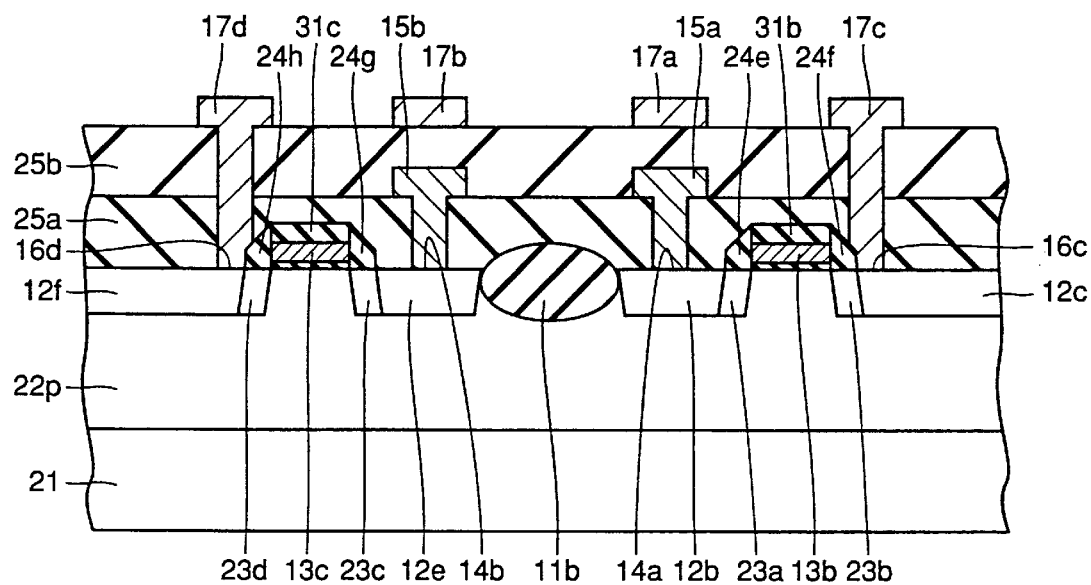
FIG. 5 is a cross sectional view showing the SRAM memory cell according to the third embodiment of the present invention.

FIG. 5 is a cross sectional view taken along the line I—I in FIG. 4. It is different from the first embodiment in that silicon nitride films or silicon nitride oxide films (hereinafter represented by silicon nitride films) 24e to 24h are used as sidewall insulation layers in FIG. 5 in place of silicon oxide films 24a to 24d used as the sidewall insulation layers of the transistor shown in FIG. 2, and in that silicon nitride films 31a to 31c are formed on polycrystalline silicon interconnections 13a to 13c.

Generally, interlayer insulation films 25a and 25b mainly include silicon oxide films. Thus, by making the silicon oxide film easy to be etched (a speed for etching the silicon oxide film is high) and making the silicon nitride film difficult to be etched (a speed for etching the silicon nitride film is low), silicon nitride films 31b, 31c and sidewall insulation layers 24e to 24h serve as etching protection films during etching for forming the above mentioned contacts. As a result, even if the first or second contact is formed close to polycrystalline silicon interconnections 13a to 13c due to manufacturing variation, the contact can be formed with a distance from polycrystalline silicon interconnections 13a to 13c. Thus, the first or second contact can be formed close to polycrystalline silicon interconnections 13a to 13c, so that reduction in the size of the memory cell, which is the object of the present invention, can be achieved.

It is noted that, although not shown in the drawings, a silicon nitride film is also formed on polycrystalline silicon interconnection 13a and, a sidewall insulation layer including a silicon nitride film is formed to cover sidewalls of polycrystalline silicon interconnection 13a and the silicon nitride film thereof.

In the structure of the present embodiment, sidewall insulation layers 24e to 24h and silicon nitride films 31b and 31c may be exposed to the first or second contact.

Now, a method of manufacturing the SRAM memory cell according to the present embodiment from a step of forming the first contact to a step of forming the first layer metal interconnection will be described.

Figure 6A:
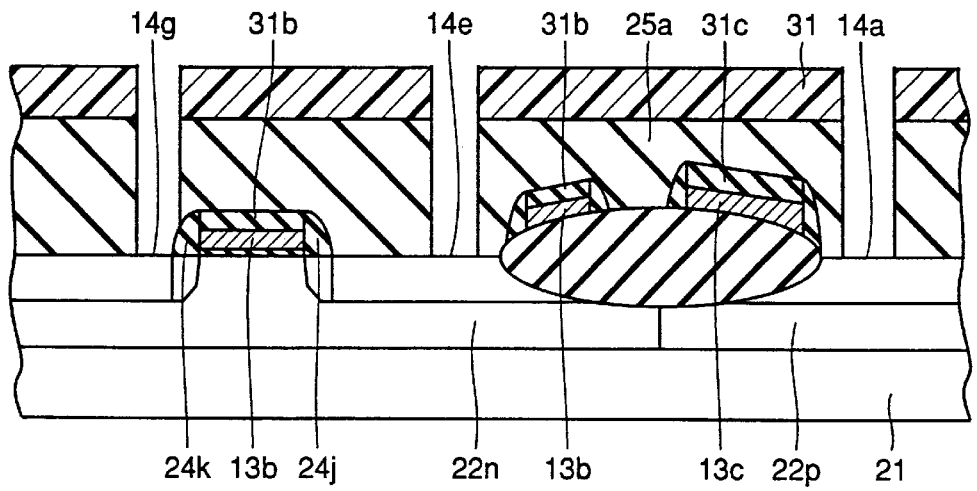
FIGS. 6A, 6B and 6C are cross sectional views showing in order a method of manufacturing the SRAM memory cell according to the third embodiment of the present invention.
Figure 6B:
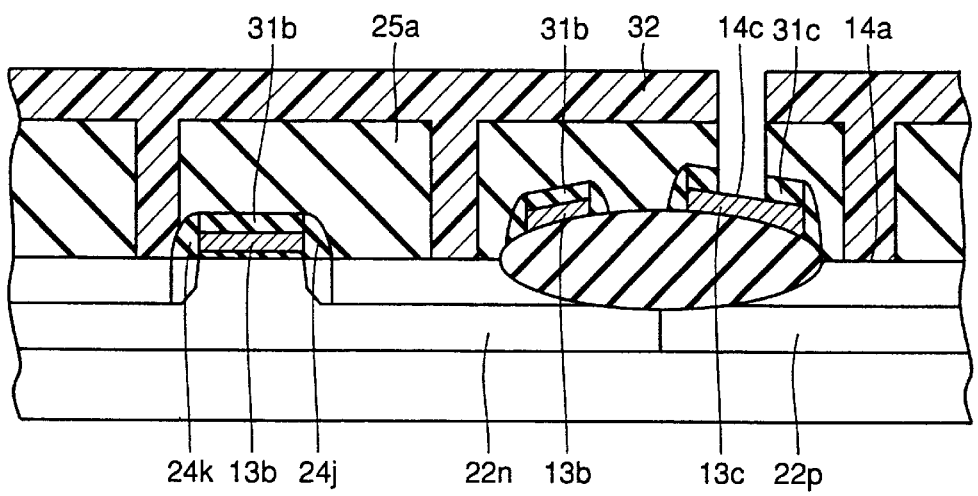
Figure 6C:
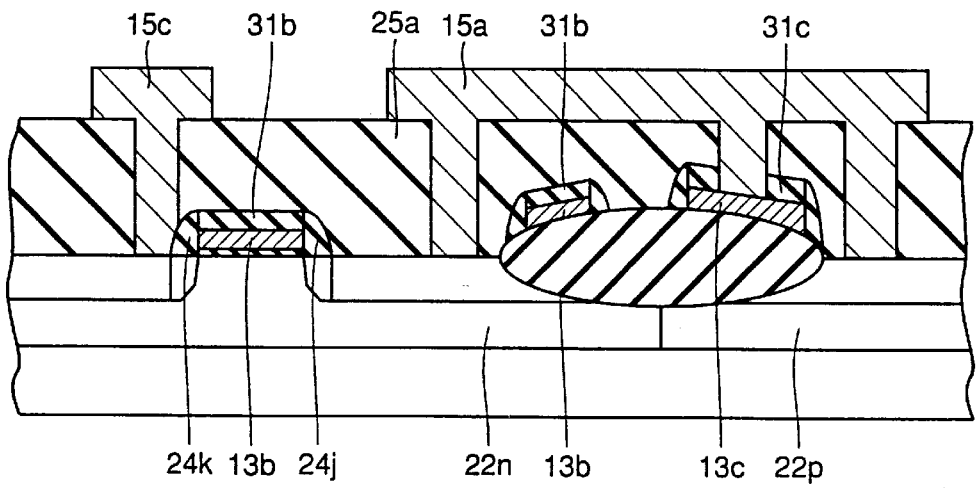

FIGS. 6A to 6C are cross sectional views showing steps of manufacturing the SRAM memory cell taken along the line J—J in FIG. 4. In FIG. 6A, an n type well 22n is adjacent to a p type well 22p. Referring to FIG. 6A, after formation of an interlayer insulation film 25a, a resist pattern 31 is formed by photolithography. By etching interlayer insulation film 25a using resist pattern 31 as a mask, first contacts 14a, 14b and 14e to 14h are formed which are connected to active regions.

It is noted that only first contacts 14a, 14e and 14g are shown in FIG. 6A.

The etching is performed such that silicon nitride films 31b, 31c and the sidewall insulation layer serve as etching protection films. Thus, even if first contact 14g in FIG. 6A overlaps polycrystalline silicon interconnection 13b when viewed from above due to manufacturing variation or the like, it is not in contact with the polycrystalline silicon interconnection 13b. Thereafter, resist pattern 31 is removed.

Then, as shown in FIG. 6B, a resist pattern 32 is formed by photolithography. By etching interlayer insulation film 25a using resist pattern 32 as a mask, first contacts 14c and 14d are formed which are connected to polycrystalline silicon interconnections 13c and 13b. It is noted that only first contact 14c is shown in FIG. 6B. The etching is performed such that silicon oxide film 25a and silicon nitride film 31c are etched to form the contact which is in contact with a polycrystalline silicon interconnection 13c. Thereafter, resist pattern 32 is removed.

As shown in FIG. 6C, first layer metal interconnections 15a to 15c are formed.

It is noted that only first layer metal interconnections 15a and 15c are shown in FIG. 6C.

In the present embodiment, general contacts 14a to 14f which are in contact with the polycrystalline silicon interconnection are formed in a step which is different from that of forming self-aligning contacts 14g and 14h which are in contact with the active regions but not with the polycrystalline silicon interconnection. Thereafter, the active regions or polycrystalline silicon interconnections 13b and 13c are connected through contacts 14a to 14h to interconnections 15a to 15c which are in the same layer. Thus, interconnections 15a to 15c which are in the above mentioned same layer can be used for connection of self-aligning contacts 14g and 14h and general contacts 14a to 14f, so that the interconnections can effectively be utilized.

Although first contacts 14a to 14h have been described in the above example, second contacts 16a to 16d can be similarly formed.

Further, although the case where the first conventional example is improved by using the self-aligning contact has been described in the present embodiment, the second conventional example using the shared contact or the first and second embodiments can also be improved.

Figure 15:
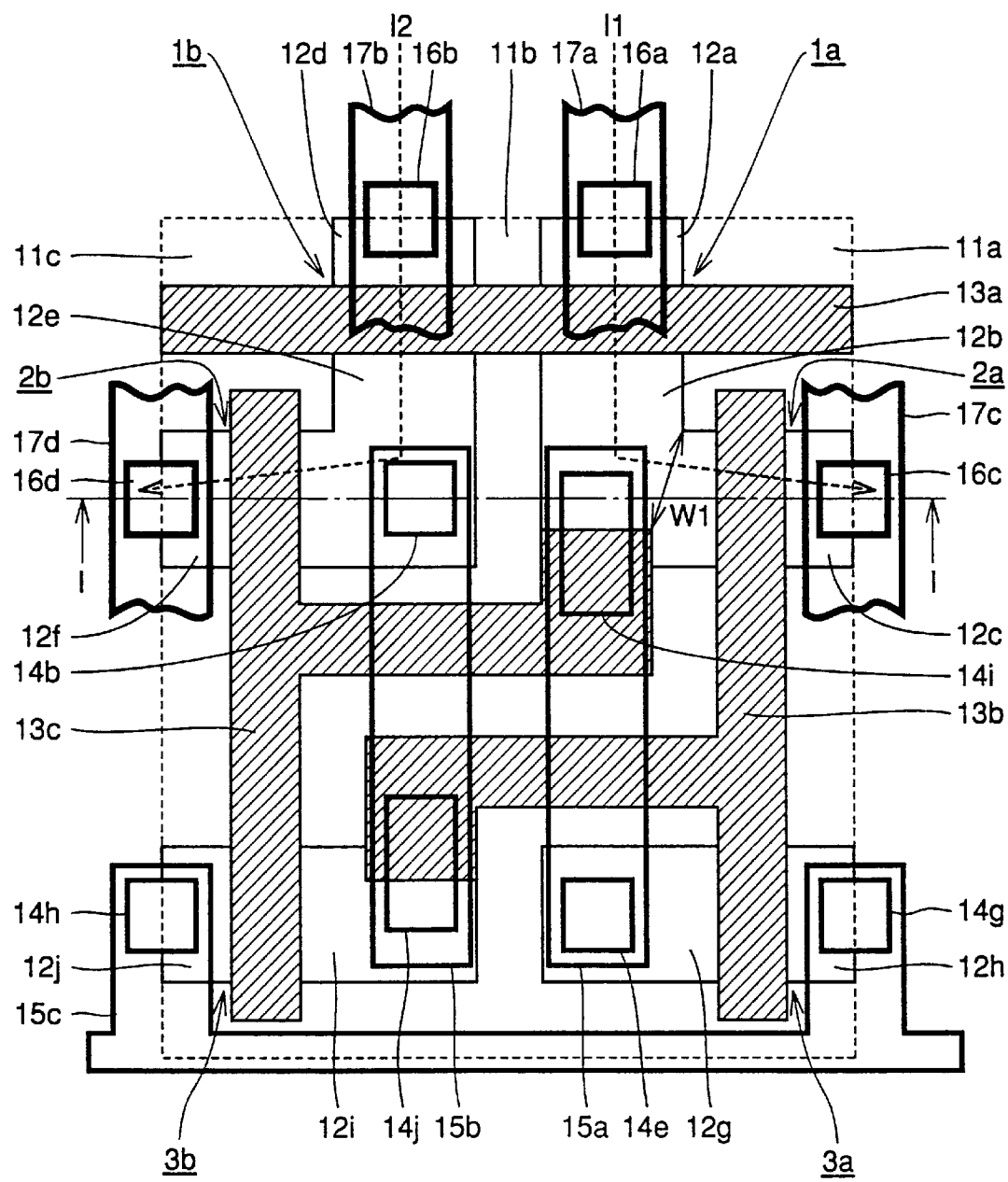
FIG. 15 is a view showing a pattern of an SRAM memory cell of a second conventional example.

In this case, shared contacts 14i, 14j and 14k (FIGS. 1, 3 and 15) can be opened when contacts 14c and 14d which are connected to polycrystalline silicon interconnections 13b and 13c are opened as shown in FIG. 6B.

Fourth Embodiment

The present embodiment is a further improvement on a third embodiment. The fourth embodiment is different from the third embodiment in that first contacts 14g and 14h overlap isolation insulation film when viewed from above and second contacts 16c and 16d overlap isolation insulation films 11a to 11c when viewed from above, with reference to FIG. 7. Here, the expression "overlapping when viewed from above" means that a contact is formed on a region in which isolation insulation films 11a to 11c are originally formed. In the region in which the contact and isolation insulation film overlap when viewed from above, the isolation insulation film may be entirely removed or partially left by etching for forming the contact.

Figure 7:
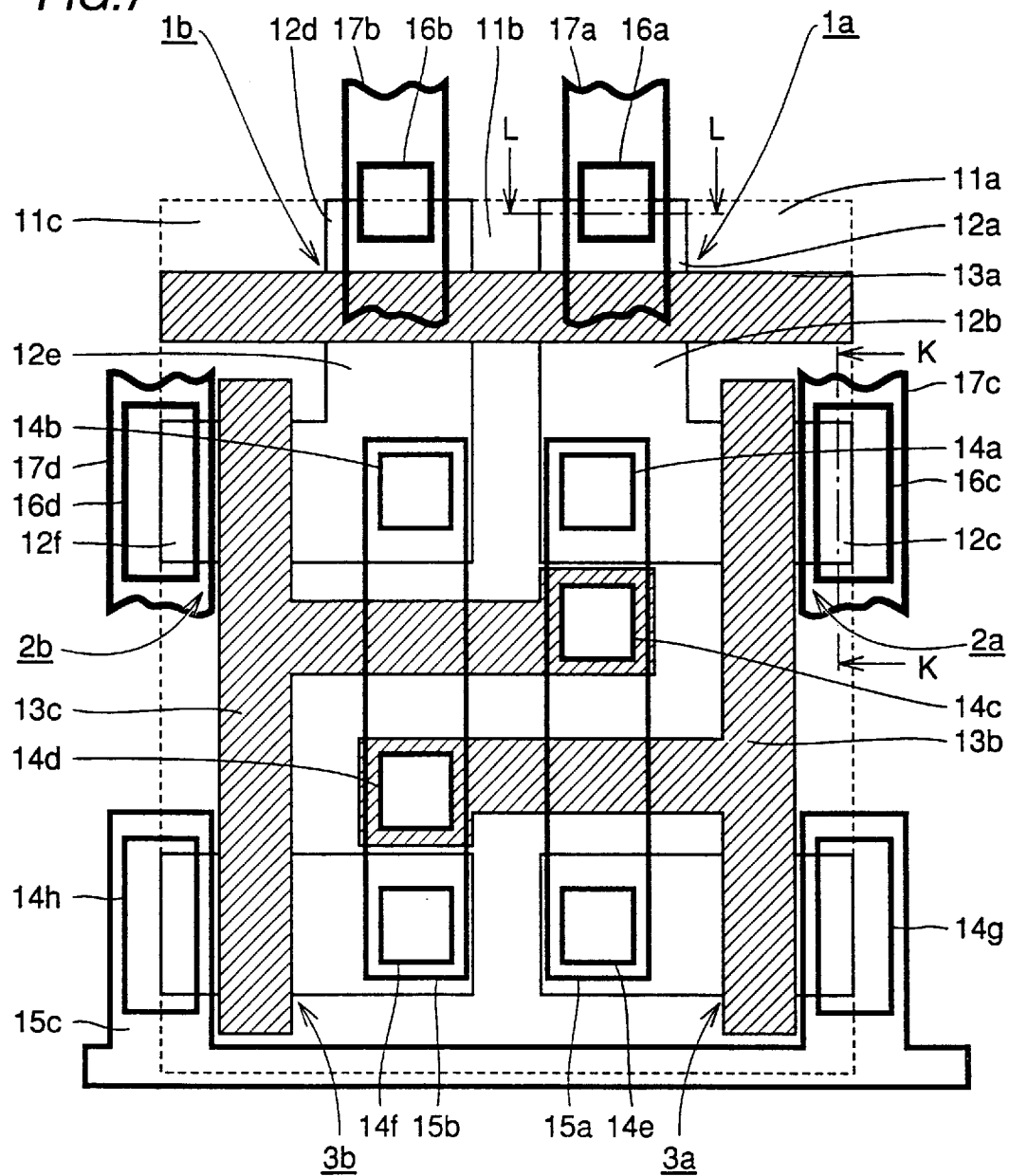
FIG. 7 is a view showing a pattern of an SRAM memory cell according to a fourth embodiment of the present invention.
Figure 8A:
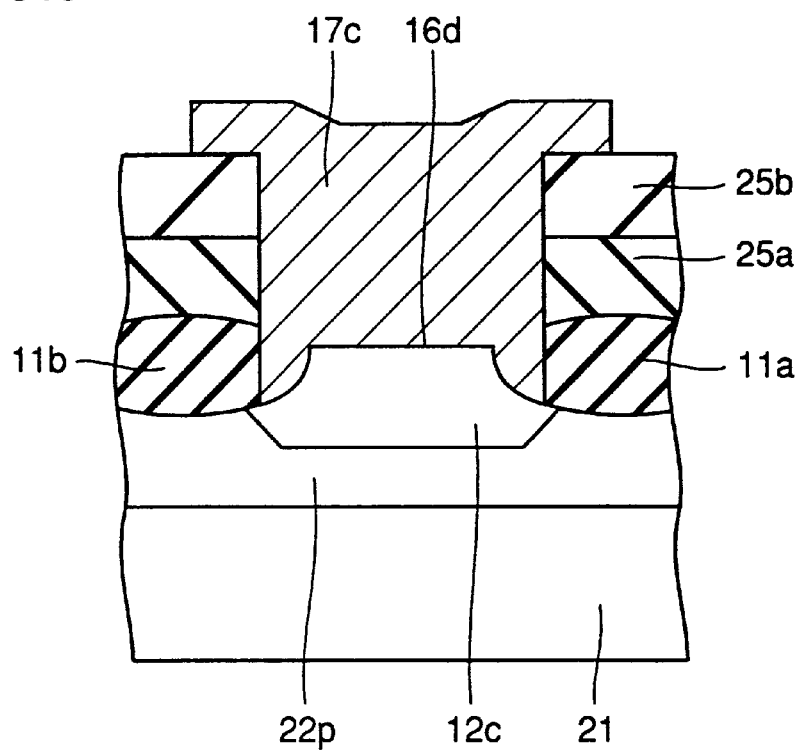
FIGS. 8A and 8B are cross sectional views showing contacts according to the fourth and fifth embodiments of the present invention.

FIG. 8A is a cross sectional view taken along the line K—K in FIG. 7. As is apparent from FIG. 8A, isolation insulation films 11a and 11b are cut and brought into contact with a silicon surface below isolation insulation films 11a and 11b. Thus, junction leakage current increases. As potentials of an n type active region 12c and a p type well 22p are almost equal, however, no problem arises even if junction leakage current flows. In the structure shown in FIG. 8A, portions of isolation insulation films 11a and 11b in the region in which contact 16d and isolation insulation films 11a and 11b overlap are removed, so that cut end surfaces of isolation insulation films 11a and 11b form sidewalls of the contact openings.

Making the contact overlap the isolation insulation film enables reduction in contact resistance, which is the object of the present invention, as the contact area substantially increases. Thus, the memory cell operation can be stabilized.

Fifth Embodiment

The present embodiment is a further improvement on the fourth embodiment. The present embodiment is different from the fourth embodiment in that second contacts 16a and 16b are increased in size in a lateral direction in the drawing in FIG. 7, so that they overlap isolation insulation films 11a to 11c when viewed from above (not shown). However, unlike contacts 16c, 16d, 14g and 14h, contacts 16a and 16b are connected to bit lines 17a and 17b. Thus, junction leakage current may increase as contacts 16a and 16b are in contact with the silicon surface below isolation insulation films 11a to 11c as shown in FIG. 8A, whereby a potential of the bit line is adversely affected.

The increase in junction leakage current is caused by the fact that the contact is in contact with the silicon surface below the isolation insulation film to allow crystal defects in a junction portion, so that leakage current tends to be generated. Thus, in the present embodiment, portions of isolation insulation films 11a to 11c are not cut during etching for forming contacts 16a and 16b such that contacts 16a and 16b are not brought into contact with the silicon surface below isolation insulation films 11a to 11c. This will be described in further detail with reference to the drawings.

Figure 8B:
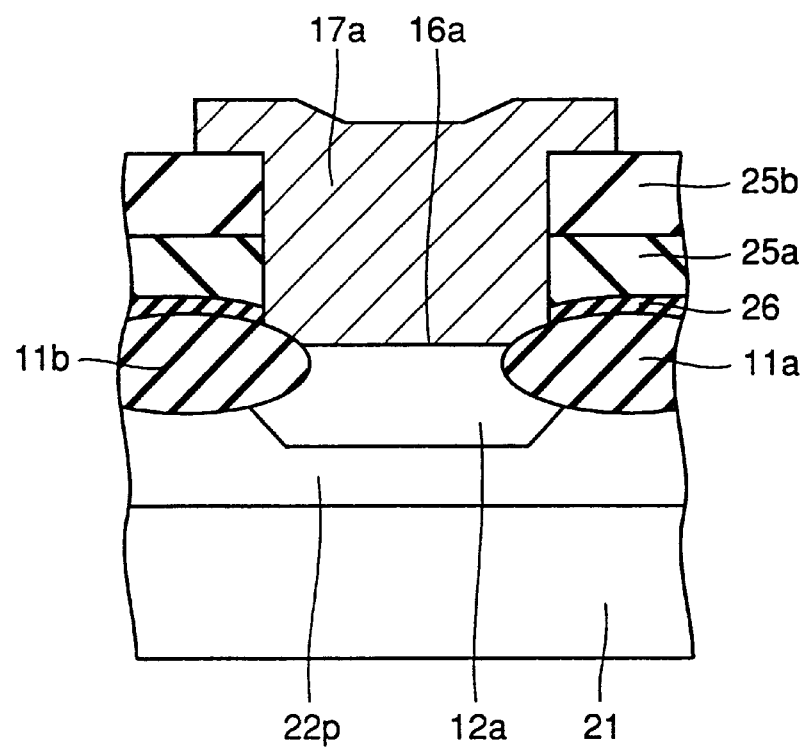

FIG. 8B is a cross sectional view taken along the line L—L when the present embodiment is applied to the memory cell shown in FIG. 7. In the present embodiment, a silicon nitride film 26 is formed below an interlayer insulation film 25a as shown in FIG. 8B.

Silicon nitride film 26 serves as an etching stopping layer during etching of interlayer insulation film 25a for forming the contact. Thus, second contact 16a can be formed without removing isolation insulation films 11a and 11b to the silicon surface.

Thus, the problem associated with the increase in junction leakage current is avoided and a contact area with an active region is increased. As a result, a memory cell with reduced contact resistance is achieved, which is the object of the present invention.

It is noted that an interconnection 17a is in contact with isolation insulation films 11a and 11b in a bottom portion of the contact opening.

In addition, in the present embodiment, cutting amounts of isolation insulation films can similarly be reduced for contacts 14g, 14h, 16c and 16d in FIG. 7, so that contacts with reduced resistances can be achieved.

Further, a structure which is similar to that shown in FIG. 8B may be applied to first contacts 14a and 14b shown in FIG. 1 and first contacts 14e and 14f shown in FIG. 4. A group of contacts for connection of storage nodes are not accompanied by a problem associated with contact resistance as compared with the contacts which are connected to the GND line or bit line. Thus, a distance between the contact and isolation insulation film can be reduced with a given contact size, so that further reduction in the size of the memory cell can be achieved, which is the object of the present invention.

In addition, a similar effect can be obtained even if the present embodiment is applied to the shared contact described in the first and second embodiments.

Referring to FIGS. 8A and 8B, in the structure in which the contact overlaps the isolation insulation film when viewed from above, the isolation insulation film or the silicon nitride film on the isolation insulation film forms the contact opening.

Sixth Embodiment

Figure 9:
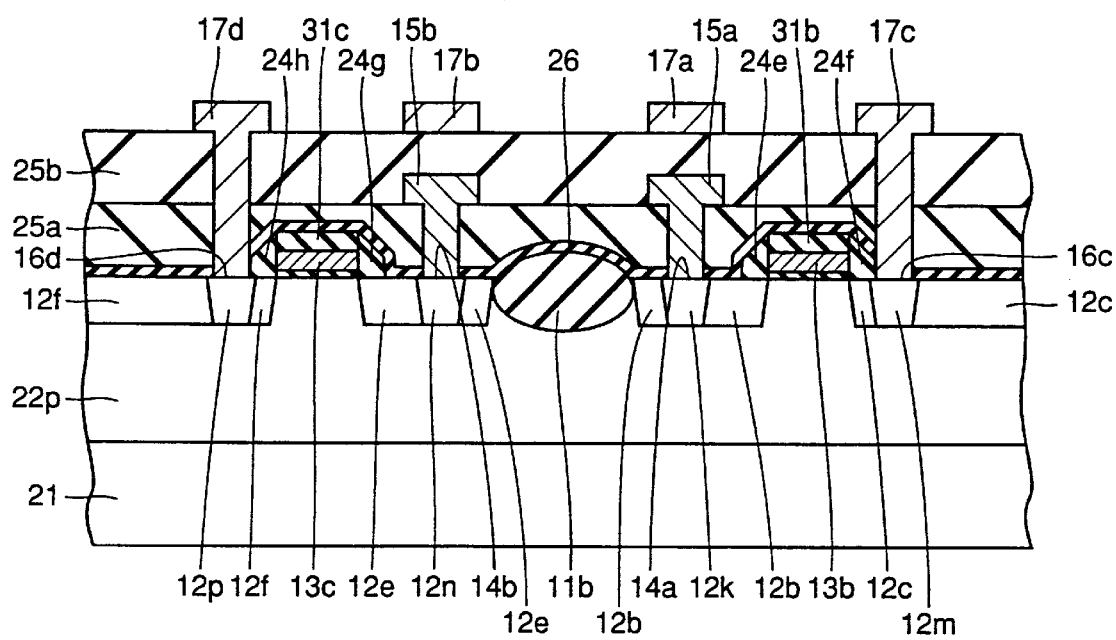
FIG. 9 is a cross sectional view taken along the line I—I in FIG. 4 showing an SRAM memory cell according to a sixth embodiment of the present invention.

The structure of the present embodiment shown in FIG. 9 is different from that shown in the cross sectional view of FIG. 5 in the active region. Referring to FIG. 5, $n^-$ active regions 23a to 23d are formed almost directly below sidewall insulation layers 24e to 24h, and $n^+$ active regions 12b, 12c, 12e and 12f are formed in other portions. In the present embodiment, on the other hand, $n^+$ active regions 12k, 12m, 12n and 12p are formed only near the positions which are almost directly below first contacts 14a, 14b and second contacts 16c, 16d as shown in FIG. 9, and $n^-$ active regions 12b, 12c, 12e and 12f are formed in other portions. It is noted that other parts of the structure are similar to those shown in FIG. 5, and therefore the same parts are denoted by the same reference characters and description thereof will not be repeated.

Now, a method of manufacturing the present embodiment will be described.

Figure 10A:
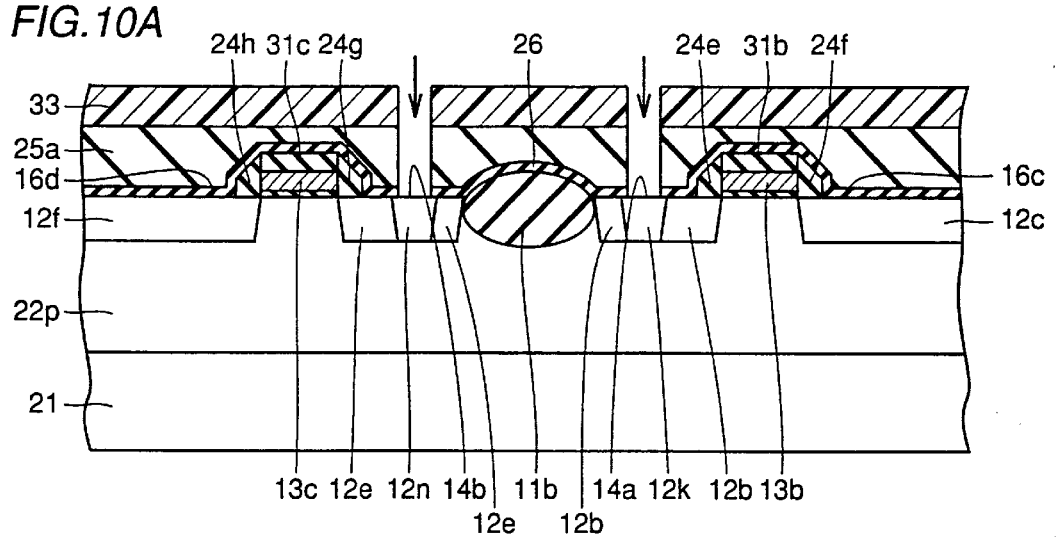
FIGS. 10A, 10B and 10C are cross sectional views showing in order a method of manufacturing the SRAM memory cell according to the sixth embodiment of the present invention.
Figure 10B:
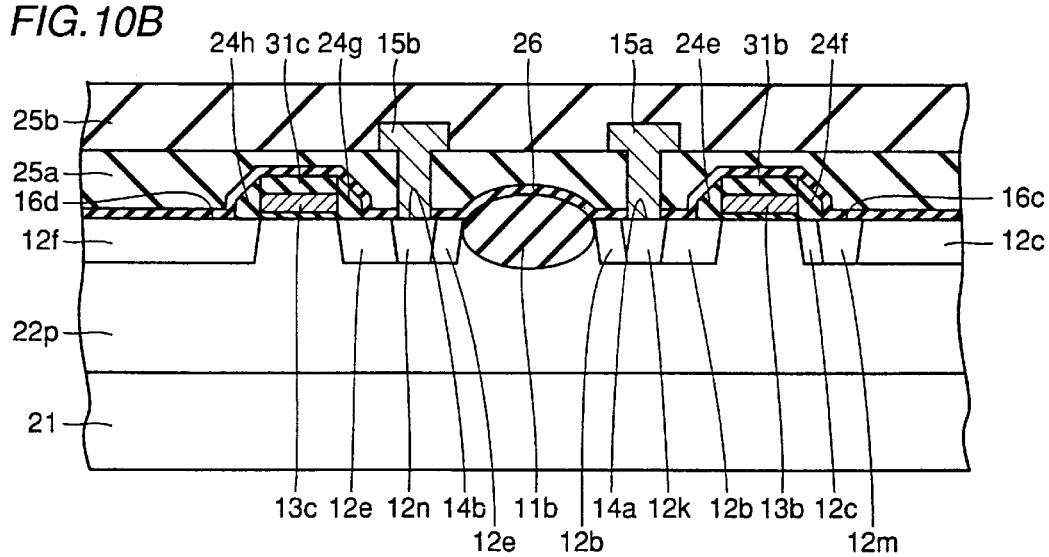
Figure 10C:
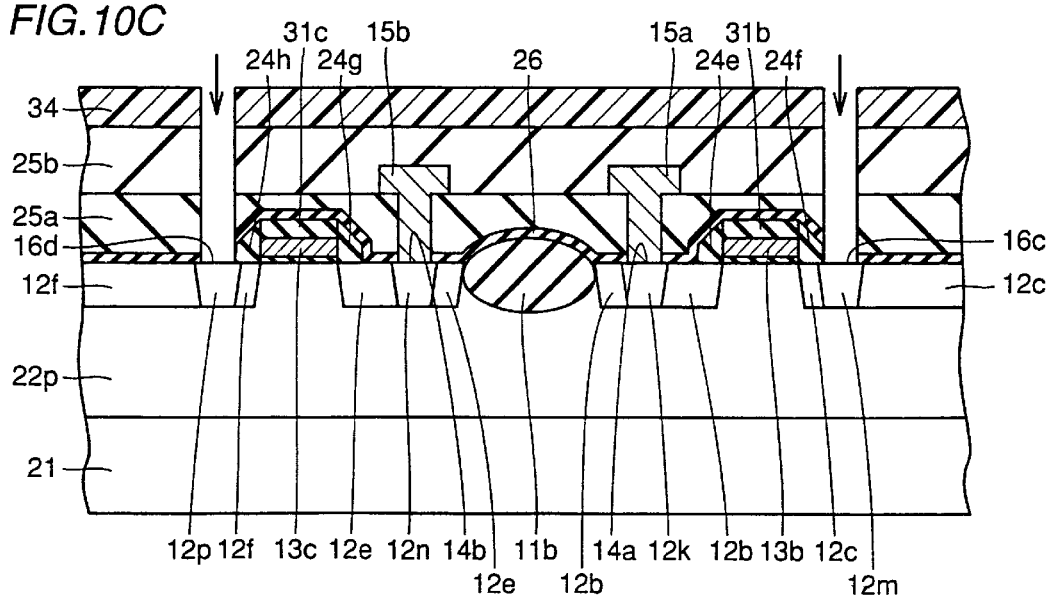

FIGS. 10A to 10C are cross sectional views taken along the line I—I in FIG. 4 which show steps from formation of the first to second contacts of the present embodiment.

Referring to FIG. 5, ion implantation for forming $n^-$ source/drain regions 23a to 23d is performed before formation of sidewall insulation layers 24e to 24h of gate sidewalls, and ion implantation for forming $n^+$ source/drain regions 12b, 12c, 12e and 12f is performed after formation of sidewall insulation layers 24e to 24h and before formation of an interlayer insulation film 25a.

In the present embodiment, ion implantation for forming $n^-$ source/drain regions 12b to 12f is performed as described above in FIG. 10A. However, ion implantation for forming $n^+$ source/drain regions 12k, 12m, 12n and 12p is not performed after sidewall insulation layers 24e to 24h and before formation of interlayer insulation film 25a.

Ion implantation for forming $n^+$ source/drain regions 12k, 12m, 12n and 12p is performed after formation of interlayer insulation film 25a as shown in FIG. 10A. In other words, after interlayer insulation film 25a is formed and first contacts 14a and 14b are opened, ion implantation for forming $n^+$ source/drain regions 12k and 12n is performed in the contact opening.

It is noted that first contacts 14a and 14b are formed by etching interlayer insulation film 25a using a resist pattern 33 as a mask. Resist pattern 33 is removed after ion implantation for forming $n^+$ source/drain regions 12k and 12n.

Then, as shown in FIG. 10B, first layer metal interconnections 15a and 15b and an interlayer insulation film 25b are formed. After second contacts 16c and 16d are opened as shown in FIG. 10C, ion implantation for forming $n^+$ source/drain regions 12m and 12p is performed in the contact opening. It is noted that second contacts 16c and 16d are formed by etching interlayer insulation films 25a and 25b using a resist pattern 34 as a mask. Resist pattern 34 is removed after ion implantation for forming $n^+$ source/drain regions 12m and 12p.

According to the present embodiment, a mask is not required for ion implantation for forming the $n^+$ source/drain regions, so that a cost of manufacturing a device is reduced as the number of masks required for manufacturing the device is reduced.

In addition, contact resistance tends to be lower when ion implantation for forming the $n^+$ source/drain regions is performed after formation of the contact as in the case of the present embodiment rather than performing general ion implantation for forming $n^+$ source/drain regions. Thus, reduction in contact resistance can be achieved which is the object of the present invention.

Although the n type active region has been described in the above embodiments, a p type active region may also be applied to provide a similar effect.

Seventh Embodiment

A seventh embodiment of the present invention is related to an interconnection connecting n and p type active regions. In the above described embodiments, for example, interconnections 15a and 15b in FIG. 1 connect the n and p type active regions and include first layer metal interconnections. However, photolithography and etching for a fine metal interconnection is difficult as compared with the case of a polycrystalline silicon interconnection. Therefore the use of the metal interconnection may be one of factors which prevent reduction in the size of the memory cell.

In the present embodiment, a p type polycrystalline silicon interconnection is used in place of first layer metal interconnections 15a to 15c shown in FIG. 1. Referring to FIG. 1, a PN junction may disadvantageously be formed in a connection portion where p type polycrystalline silicon interconnections 15a, 15b and n type active regions 12b, 12e are connected.

When p type polycrystalline silicon interconnections 15a and 15b are used as in the present embodiment, however, the PN junction would not be formed which adversely affects the memory cell operation. On the other hand, when n type polycrystalline silicon interconnections are used in place of first layer metal interconnections 15a to 15c, the PN junction is formed in the connection portion of n type polycrystalline silicon interconnections 15a to 15c and p type active regions 12g to 12j, thereby adversely affecting the cell operation.

Thus, the use of the p type polycrystalline silicon interconnection enables further reduction in the size of the memory cell, which is the object of the present invention, while avoiding the problem associated with the PN junction.

It is noted that the p type polycrystalline silicon interconnection can be applied to Vcc interconnection 15c shown in FIG. 1.

Further, the p type polycrystalline silicon interconnection herein is not limited to a single layer and, for example, may include two layers of p type polycrystalline silicon and silicide.

It is noted that the present embodiment is not only applied to the first embodiment but also to the other embodiments.

Eighth Embodiment

Figure 11:
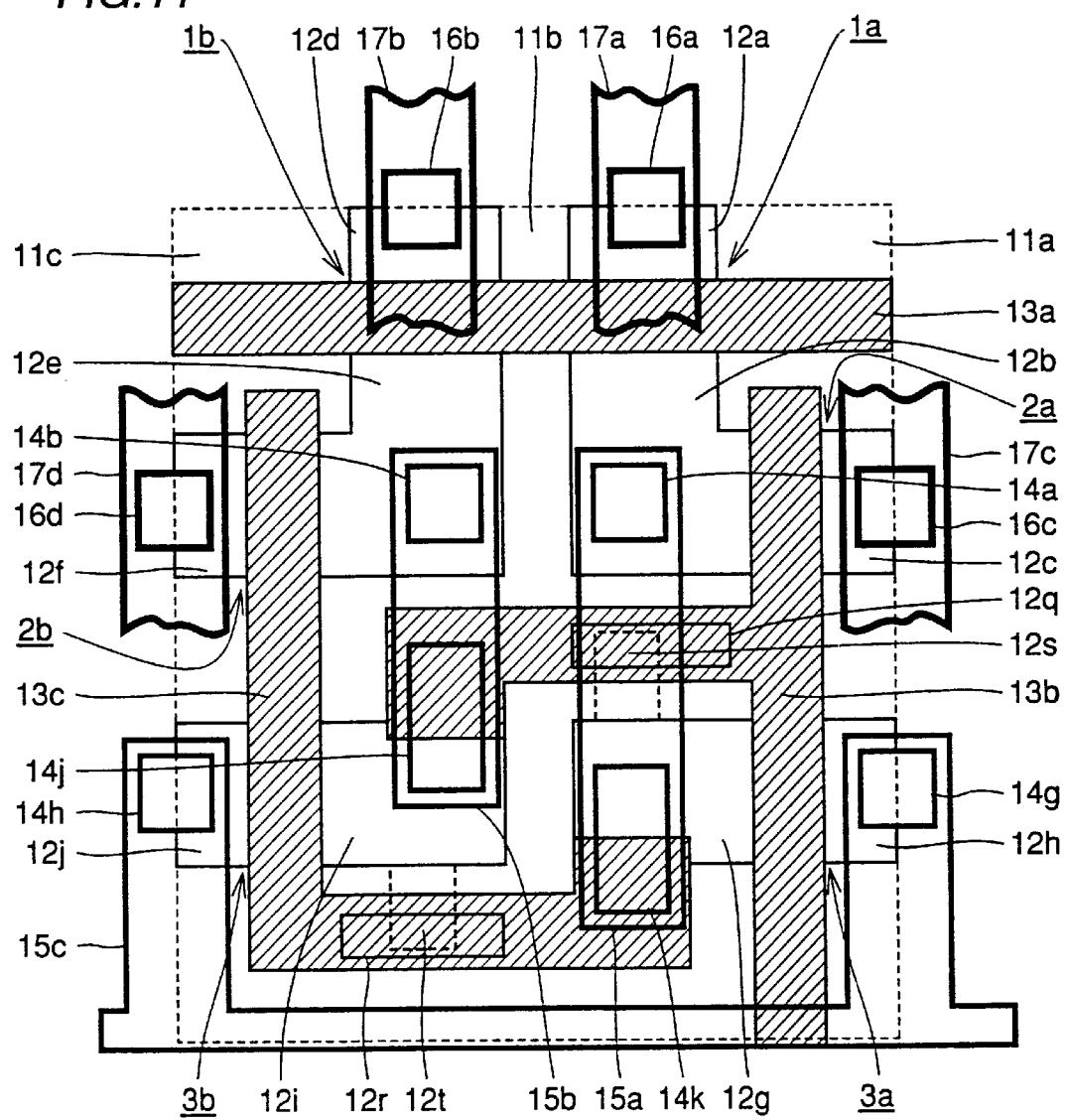
FIG. 11 is a view showing a pattern of an SRAM memory cell according to an eighth embodiment of the present invention.

A structure of the present embodiment is different from that shown in FIG. 1 in that active regions 12q and 12r are further provided as shown in FIG. 11. Active region 12q is formed to be covered with a polycrystalline silicon interconnection 13b, and active region 12r is formed to be covered with a polycrystalline silicon interconnection 13c. Thus, a capacitance is formed between polycrystalline silicon interconnections 13b, 13c and active regions 12q, 12r with a gate insulation film of a transistor interposed. Provision of the capacitance as in the present embodiment allows increase in accumulated electric charges, so that increase in software error resistance, which is the object of the present invention, can be achieved.

It is noted that active regions 12q and 12r in this case may have any of n and p type conductivity.

Although active regions 12q and 12r are separated from other active regions by an isolation insulation film in FIG. 11, active regions 12q and 12r may be connected to drain active regions 12g and 12i. Active regions for forming capacitances connected to drain active regions 12g and 12i may be for example active regions 12s and 12t defined by dotted lines in FIG. 11 to provide a similar effect. Further, active regions for forming capacitances may be connected to source active regions. The active region connected to the drain regions may be provided somewhere below polycrystalline silicon interconnections 13b and 13c in FIG. 11. In the case of the active regions connected to the source regions, however, arrangements of polycrystalline silicon interconnections 13b and 13c must be changed and the pattern becomes more complicated. Therefore, the active regions are more preferably connected to the drain region.

Even when the active regions connected to drain active regions 12b and 12e are opposite to polycrystalline silicon interconnections 13b and 13c with the gate insulation film interposed, a similar effect can be obtained.

The present embodiment cannot only be applied to the first embodiment but also to the other embodiments.

In the first to eighth embodiments, the access transistor has been described as being the n type transistor. The access transistor may be a p type transistor to provide a similar effect. In this case, the n type transistor in FIG. 1 is changed to the p type transistor, and the p type transistor in FIG. 1 is changed to the n type transistor.

Further, in the first to eighth embodiments, although the interconnection connecting the n type and p type active regions and the Vcc interconnection have been described as first layer metal interconnections 13a to 13c, and the GND interconnection and bit line have been described as being second layer metal interconnections 17a to 17d, any of the above mentioned interconnections may be the first layer or second layer metal interconnection.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static semiconductor memory device, comprising:
   a first drain active region of a first transistor having a first type conductivity;
   a second drain active region of a second transistor having the first type conductivity;
   a third drain active region of a third transistor having a second type conductivity;
   a fourth drain active region of a fourth transistor having the second type conductivity;
   a first active region of a fifth transistor having the first type conductivity and a second active region electrically connected to said first drain active region;
   a third active region of a sixth transistor having the first type conductivity and a fourth active region electrically connected to said second drain active region;
   a first gate interconnection successively arranged for and shared by said first transistor and said third transistor;
   a second gate interconnection successively arranged for and shared by said second transistor and said fourth transistor;
   a first local interconnection electrically connecting said first drain active region, said third drain active region and said second gate interconnection and electrically connected to said third drain active region and said second gate interconnection through a first shared contact; and
   a second local interconnection electrically connecting said second drain active region, said fourth drain active region and said first gate interconnection and electrically connected to said fourth drain active region and said first gate interconnection through a second shared contact.

2. The static semiconductor memory device according to claim 1, wherein an area in which said first local interconnection and said third drain active region are in contact is larger than that in which said first local interconnection and said second gate interconnection are in contact in said first shared contact, and
   an area in which said second local interconnection and said fourth drain active region are in contact is larger than that in which said second local interconnection and said first gate interconnection are in contact in said second shared contact.

3. The static semiconductor memory device according to claim 1, further comprising an active region formed directly below said first or second gate interconnection with an insulation layer interposed and separated from all of said first to fourth drain active regions.

4. The static semiconductor memory device according to claim 1, further comprising an active region formed directly below said first or second gate interconnection with an insulation layer interposed and connected to one of said first to fourth drain active regions.

5. A static semiconductor memory device, comprising:
   a first drain active region and a first source active region of a first transistor having a first type conductivity;
   a second drain active region and a second source active region of a second transistor having the first type conductivity;
   a third drain active region of a third source active region of a third transistor having a second type conductivity;
   a fourth drain active region and a fourth source active region of a fourth transistor having the second type conductivity;
   a first active region of a fifth transistor having the first type conductivity and a second active region electrically connected to said first drain active region;
   a third active region of a sixth transistor having the first type conductivity and a fourth active region electrically connected to said second drain active region;

a first gate interconnection successively arranged for and shared by said first transistor and said third transistor;

a second gate interconnection successively arranged for and shared by said second transistor and said fourth transistor;

a third gate interconnection successively arranged for and shared by said fifth transistor and said sixth transistor;

a first local interconnection electrically connecting said first drain active region, said third drain active region and said second gate interconnection through a first contact group;

a second local interconnection electrically connecting said second drain active region, said fourth drain active region and said first gate interconnection through a second contact group;

a first power supply interconnection electrically connected to said first source active region at a first contact having a contact structure of self-aligning with said first gate interconnection and electrically connected to said second source active region at a second contact having a contact structure of self-aligning with said second gate interconnection;

a second power supply interconnection electrically connected to said third source active region at a third contact having a contact structure of self-aligning with said first gate interconnection and electrically connected to said fourth source active region at a fourth contact having a contact structure of said self-aligning with said second gate interconnection;

a first bit line electrically connected to said first active region at a fifth contact having a contact structure of self-aligning with said third gate interconnection; and a second bit line electrically connected to said third active region at a sixth contact having a contact structure of self-aligning with said third gate interconnection.

6. The static semiconductor memory device according to claim 5, further comprising:

a first protection insulation film formed on said first gate interconnection;

a second protection insulation film formed on said second gate interconnection;

a third protection insulation film formed on said third gate interconnection;

a first sidewall insulation film formed in contact with sidewalls of said first interconnection for gate electrode and said first protection insulation film;

a second sidewall insulation film formed in contact with sidewalls of said second gate interconnection and said second protection insulation film;

a third sidewall insulation film formed in contact with sidewalls of said third gate interconnection and said third protection insulation film; and an interlayer insulation film covering said first, second and third protection insulation films and said first, second and third sidewall insulation films and including a material different from a material of said first, second and third protection insulation films and said first, second and third sidewall insulation films.

7. The static semiconductor memory device according to claim 6, wherein said material of said first, second and third protection insulation films and said first, second and third sidewall insulation films includes silicon nitride and said material of said interlayer insulation film includes silicon oxide.

8. The static semiconductor memory device according to claim 5, further comprising isolation insulation films on either side of each of said first to fourth source active regions and said first and third active regions, and wherein at least one of said first to sixth contacts overlaps said isolation insulation films on said either side when viewed from above.

9. The static semiconductor memory device according to claim 8, wherein an interconnection used for connection at said contact is in contact with said isolation insulation film at a bottom part of said contact in a portion in which said contact and said isolation insulation film overlap when viewed from above, and said static semiconductor memory device is further provided with a protection film for contact etching on said isolation insulation film.

10. The static semiconductor memory device according to claim 9, further comprising:

a seventh contact included in said first contact group and formed in said first drain active region;

an eighth contact included in said second contact group and formed in said second drain active region;

a ninth contact included in said first contact group and formed in said third drain active region; and a tenth contact included in said second contact group and formed in said fourth drain active region, and wherein said first local interconnection is in contact with said isolation insulation film at bottom portions of said seventh and ninth contacts and said second local interconnection is in contact with said isolation insulation film at bottom portions of said eighth and tenth contacts in a portion in which said seventh to tenth contacts and said isolation insulation film overlap when viewed from above.

11. The static semiconductor memory device according to claim 5, wherein said first to fourth drain active regions, said first to fourth source active regions and said first to fourth active regions have higher impurity concentrations only in portions directly below and in vicinity of said first and second contact groups and said first to sixth contacts, and have lower impurity concentrations in other portions.

12. The static semiconductor memory device according to claim 5, further comprising an active region formed directly below said first or second gate interconnection with an insulation layer interposed and separated from all of said first to fourth drain active regions.

13. The static semiconductor memory device according to claim 5, further comprising an active region formed directly below said first or second gate interconnection with an insulation layer interposed and connected to one of said first to fourth drain active regions.

14. A static semiconductor memory device, comprising:

a first drain active region of a first transistor having a first type conductivity;

a second drain active region of a second transistor having the first type conductivity;

a third drain active region of a third transistor having a second type conductivity;

a fourth drain active region of a fourth transistor having the second type conductivity;

a first active region of a fifth transistor having the first type conductivity and a second active region electrically connected to said first drain active region;

a third active region of a sixth transistor having the first type conductivity and a fourth active region electrically connected to said second drain active region;

a first gate interconnection successively arranged for and shared by said first transistor and said third transistor;

a second gate interconnection successively arranged for and shared by said second transistor and said fourth transistor;

a first local interconnection electrically connecting said first drain active region, said third drain active region and said second gate interconnection and including polycrystalline silicon with p type impurities; and a second local interconnection electrically connecting said second drain active region, said fourth drain active region and said first gate interconnection and including polycrystalline silicon with the p type impurities.

15. The static semiconductor memory device according to claim 14, further comprising an active region formed directly below said first or second gate interconnection with an insulation layer interposed and separated from all of said first to fourth drain active regions.

16. The static semiconductor memory device according to claim 14, further comprising an active region formed directly below said first or second gate interconnection with an insulation layer interposed and connected to one of said first to fourth drain active regions.

* * * * *